United States Patent
Bottomley et al.

(10) Patent No.: US 7,251,770 B2
(45) Date of Patent: Jul. 31, 2007

(54) METHOD AND APPARATUS FOR DECODING OF TURBO ENCODED DATA IN A COMMUNICATION SYSTEM

(75) Inventors: Gregory E. Bottomley, Cary, NC (US); Rajaram Ramesh, Cary, NC (US); Jung-Fu Cheng, Cary, NC (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 500 days.

(21) Appl. No.: 10/915,134

(22) Filed: Aug. 10, 2004

(65) Prior Publication Data

US 2005/0289429 A1   Dec. 29, 2005

Related U.S. Application Data

(60) Provisional application No. 60/583,510, filed on Jun. 28, 2004.

(51) Int. Cl.
*H03M 13/29* (2006.01)
*H03M 13/41* (2006.01)

(52) U.S. Cl. ..................... 714/755; 714/780

(58) Field of Classification Search ............... 714/755, 714/780; H03M 13/29, 13/41
See application file for complete search history.

(56) References Cited

U.S. PATENT DOCUMENTS

2004/0237019 A1* 11/2004 Lin ........................... 714/755
2005/0204255 A1* 9/2005 Yeh et al. ................. 714/755
2005/0204256 A1* 9/2005 Yeh et al. ................. 714/755

FOREIGN PATENT DOCUMENTS

GB  2352943 A  2/2001

OTHER PUBLICATIONS

Sadowsky, J.S. A maximum likelihood decoding algorithm for turbo codes; Global Telecommunications conference, 1997. GLOBECOM '97., IEEE; Publications Date: Nov. 3-8, 1997; pp. 929-933, vol. 2; INSPEC Accession No. 5931966: Section II and III.
Krishna R. Narayanan and Gordon L. Stuber: List Decoding of Turbo Codes , IEEE Transactions on Communications, vol. 46. No. 6 Jun. 1998, pp. 754-762.
Wangrok Oh, Youhan Kim, and Kyungwhoon Cheun: Improving the Performance of Turbo Codes With Simple Protection Scheme for Error-Prone Bit Positions, IEEE Transactions on Communications. vol. 53. No. 11, Nov. 2005, pp. 1777-1781.

* cited by examiner

*Primary Examiner*—R. Stephen Dildine

(57) ABSTRACT

A method and apparatus for decoding turbo encoded data. A first turbo decoding iteration is performed to produce a most likely sequence of symbols, each symbol having an amplitude value and a positive or negative sign. The sequence of symbols is error checked, and if an error is detected, the apparatus forms a next most likely sequence by reversing the positive or negative sign of the symbol having the smallest amplitude. If an error is again detected, additional sign reversals are performed on symbols with larger amplitudes, and on multiple symbols. Each modification is error checked. If none of the modifications produce an error-free sequence, and a maximum number of modifications are performed, the apparatus performs another turbo decoding iteration to produce another sequence of symbols. The process is then repeated until an error-free sequence is produced or a maximum number of iterations are performed.

21 Claims, 8 Drawing Sheets

METHOD AND APPARATUS FOR DECODING OF TURBO ENCODED DATA IN A COMMUNICATION SYSTEM

BACKGROUND

The present invention relates to communication systems. More particularly, and not by way of limitation, the present invention is directed to a method and apparatus for decoding of a turbo encoded data stream in a radio telecommunication system.

In a cellular radio telecommunication system such as a Wideband Code Division Multiple Access (WCDMA) system, data frames or packets may be encoded in a process known as turbo encoding. These systems use forward error correction (FEC) encoding (turbo code) as well as forward error detection encoding using, for example a cyclic redundancy check (CRC). The challenge is to successfully recover the transmitted encoded block of information.

The standard approach is to apply turbo decoding. Existing methods of turbo decoding are more fully described in the article, C. Berrou et al., "Near Optimum Error Correcting Coding and Decoding: Turbo-Codes," *IEEE Trans. Commun.*, Vol. 44, pp 1261-1271, October 1996, which is incorporated herein by reference. Turbo codes are a new class of error-control coding systems that offer near optimal performance while requiring only moderate complexity. The widely used iterative decoding algorithm for turbo-codes is a special case of a general local message-passing algorithm for efficiently computing a posteriori probabilities in acyclic directed graphical (ADG) models (also known as "belief networks"). Iterative decoding is used and the iterative process is stopped when the CRC checks. If the CRC does not check after a predefined number of iterations, the frame is declared to be in error, and other mechanisms, such as Automatic Repeat Request (ARQ), are used to recover the lost information.

The disadvantage of this approach is that the decoder may be close to the right answer, but because the CRC detects an error, the frame is lost. In fact, the decoder may be close to the right answer early in the iterative process, and performing additional iterations to get the answer right unnecessarily utilizes system resources.

In systems employing a convolutional code instead of a turbo-code, generalized Viterbi decoding (also referred to as "list Viterbi decoding") provides improved performance. With this approach, the decoder finds the most likely set of decoded bits, the second most likely set of decoded bits, and so on. If the CRC detects an error in the most likely set of bits, then the CRC check is applied to the second most likely, and so on. As a result, the decoder successfully decodes some frames that would have been declared in error based on conventional decoding. Viterbi decoding is more fully described in the following articles: T. Hashimoto, "A List-type Reduced-constraint Generalization of the Viterbi Algorithm," *IEEE Trans. Inf. Theory*, Vol. IT-33, pp. 866-876, November 1987; C. Nill et al., "List and Soft Symbol Output Viterbi Algorithms: Extensions and Comparisons," *IEEE Trans. Commun.*, Vol. 43, pp. 277-287, February/March/April 1995; and N. Seshadri et al., "List Viterbi Decoding Algorithms With Applications," *IEEE Trans. Commun.*, Vol. 42, pp. 313-323, February/March/April 1994. Each of these articles is incorporated herein by reference.

It is noted that the generalized Viterbi approach trades error detection capability for better information recovery. This approach has been shown to provide significant gains in performance. Unfortunately, however, the algorithms developed for generalized Viterbi decoding cannot be used with turbo decoders, because turbo decoders do not perform Viterbi decoding.

It would be advantageous to have a method and apparatus for decoding of turbo encoded data that overcomes the disadvantages of existing methods while also providing significant gains in performance. The present invention provides such a method and apparatus.

SUMMARY

In one aspect, the present invention is directed to a method of decoding turbo encoded data. The method includes performing a decoding iteration to produce a sequence of symbols, each symbol having an amplitude value and a positive or negative sign. This is followed by detecting whether the decoded sequence of symbols contains an error, and if the decoded sequence of symbols contains an error, performing a first modification of the decoded sequence by reversing the positive or negative sign of at least one symbol in the decoded sequence. The method then detects whether the first modification has produced a sequence of symbols that is error free. The method may continue by performing additional modifications of the sequence, and performing error checking on each modification. If none of the modifications produce an error-free sequence, the method may perform another decoding iteration to produce another sequence of symbols.

In another aspect, the present invention is directed to a method of decoding turbo encoded data, that includes the steps of (a) performing a first turbo decoding iteration to produce a most likely sequence of symbols, each symbol having an amplitude value and a positive or negative sign; (b) checking the most likely sequence of symbols to determine whether the most likely sequence contains an error; (c) if the most likely sequence of symbols contains an error, forming a next most likely sequence by reversing the positive or negative sign of at least one symbol in the most likely sequence; (d) checking the next most likely sequence of symbols to determine whether the next most likely sequence contains an error; and (e) repeating steps (c) and (d) for less likely sequences until a maximum number of sequences for the first decoding iteration have been checked, or an error-free sequence is detected, whichever is first.

In yet another aspect, the present invention is directed to a method of decoding turbo encoded data that performs a plurality of decoding iterations. Each iteration produces a sequence of symbols, and following each iteration, the method detects whether the sequence of symbols produced by each iteration contains an error. If a sequence produced by an iteration contains an error, the method sequentially performs a predefined number of modifications to the sequence produced by each iteration. Following each modification of each sequence, the method detects whether the modified sequence of symbols contains an error. If a sequence is detected with no errors, the error-free sequence is forwarded as decoded data.

In still yet another aspect, the present invention is directed to an apparatus for decoding turbo encoded data. The apparatus includes turbo decoding means for performing a turbo decoding iteration to produce a sequence of symbols, each symbol having an amplitude value and a positive or negative sign. The apparatus also includes error-detecting means for detecting whether the decoded sequence of symbols contains an error. The apparatus also includes sequence-modifying means responsive to detection of an error, for performing a first modification of the decoded sequence by reversing the positive or negative sign of at least one symbol in the decoded sequence, and forwarding the modified sequence to the error-detecting means. The error-detecting means then detects whether the first modification has produced a sequence of symbols that is error free. If not, the apparatus may perform additional modifications of the sequence, each of which is individually error-checked before the next modification is performed. If none of the modifications produce an error-free sequence, the apparatus may repeat the decoding process by performing another decoding iteration to produce another sequence of symbols, and repeating the error-checking and sequence-modifying steps.

BRIEF DESCRIPTION OF THE SEVERAL VIEWS OF THE DRAWINGS

In the following section, the invention will be described with reference to exemplary embodiments illustrated in the figures, in which.

DETAILED DESCRIPTION

Figure 1:
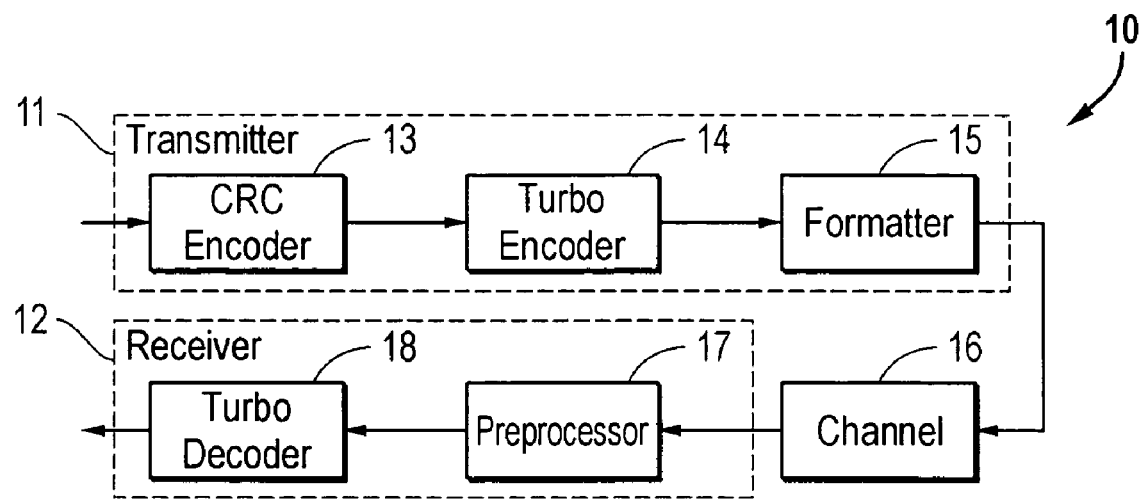
FIG. 1 is a simplified block diagram of a communication system according to the present invention.

In accordance with the teachings of the present invention, an improved turbo decoder is provided based on the principles of generalized Viterbi decoding of convolutional codes. As a result, multiple decoded symbol sequences are considered at the end of a turbo decoding iteration. If the CRC fails on the first sequence, the CRC check is applied to the second sequence, and so forth. If the CRC succeeds, the frame is considered to be successfully decoded. This process provides several benefits. First, if the process is applied when the last turbo decoding iteration fails, it allows more frames to be recovered. This reduces the use of ARQ, thereby reducing delay and increasing system throughput. Second, if the process is applied at earlier iterations, the number of iterations needed to successfully decode the frame can be reduced. The process may also reduce complexity or increase the decoding capability of a given resource.

After an iteration of turbo decoding, the turbo decoder produces soft values related to symbol "loglikelihoods". The positive or negative signs of these soft values give the hard values, to which a CRC check can be applied. The amplitudes correspond to confidence values. The hard values may also be referred to as "symbol values", and the amplitudes may be referred to as "soft information". If the CRC checks, then the decoded symbols provide the information sent. If the CRC fails, then the second most likely set of symbols is checked. The second most likely set is obtained by reversing the positive or negative sign (i.e., hard value) of the symbol with the smallest soft value amplitude. If the CRC checks, then the decoded symbols provide the information sent. If not, the third most likely set of symbols may be checked. Determining the $K^{th}$ most likely sequence may involve reversing multiple signs or symbol values, as discussed in more detail below.

This process can continue up the $K^{th}$ most likely sequence. If none of the sequences pass the CRC, then another iteration of turbo decoding is performed before trying again. Note that K is a parameter that may depend on which iteration is being performed. For example, it may be advantageous to either not check CRC (K=0) or check only the most likely sequence (K=1) after only one or a few iterations, because the risk of the CRC checking for an erroneous sequence may be too high. The choice for K may depend on the block length, the turbo code used, and/or the CRC or error detection code used. The more powerful the error detection code, the higher that K can be without sacrificing too much error detection performance. Note that K may be as small as 1 or 2.

Also, K may be adaptive, depending on the size of the soft value amplitudes. For example, the signs of up to M bits may be reversed, where M is the number of bits whose soft amplitudes fall below a predefined threshold. This threshold may be a fraction of the maximum or average soft amplitude value. In the example described herein, K and M are defined by the relationship, $K=2^M$.

As noted above, the CRC may not be checked after every iteration. In other words, it may be advantageous to periodically check the most likely sequence, and/or check sequences other than the most likely sequence, only after performing a defined number of intervening decoding iterations. For example, the CRC may be checked every other iteration, every third iteration, and so on.

FIG. 1 is a simplified block diagram of a communication system 10 according to the present invention. The system may be wireless or wireline (for example, fiber optic cable, copper cable, or a computer network), and includes, generally, a transmitter 11 and a receiver 12. In the transmitter, an encoder such as a CRC encoder 13 error-detection-encodes information symbols to be transmitted. A turbo encoder 14 then turbo encodes the symbols (including interleaving). A formatter 15 formats the result for the channel 16 to be used. For a wireless channel, the turbo encoder output is modulated, and the signal is provided to an antenna (not shown). For a wireline channel, the result may be line coded in a known manner. The encoded signal is then sent to the receiver. At the receiver, a preprocessor 17 recovers the turbo encoded symbols from the signal. For example, in a wireless system, the preprocessor may include a front-end processor (processing an antenna signal to convert to baseband samples) followed by a demodulator (Rake receiver). The preprocessed symbols are then provided to a turbo decoder 18.

Figure 2:
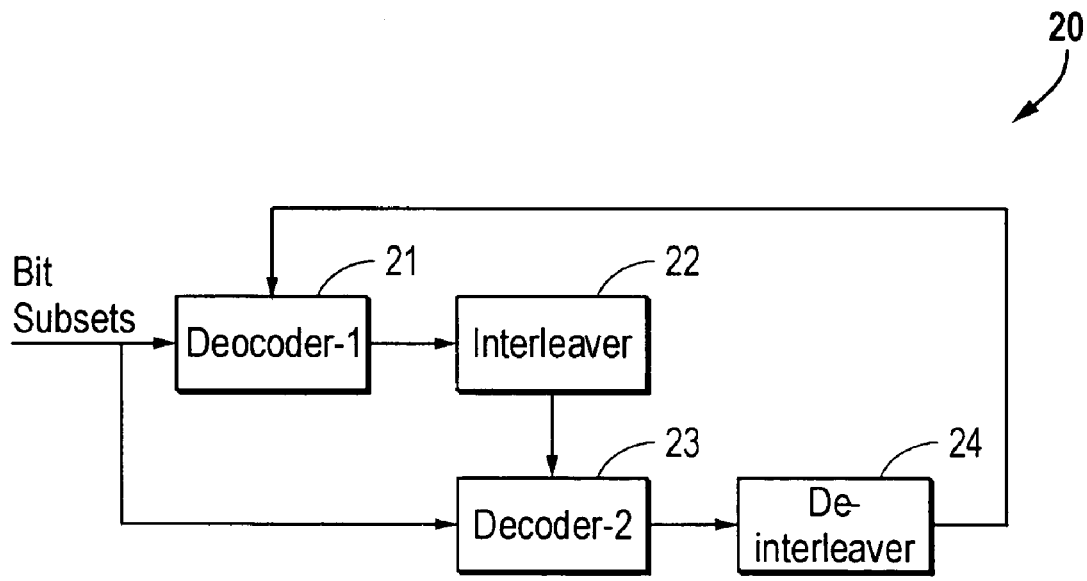
FIG. 2 is a simplified block diagram of a conventional turbo decoder.

FIG. 2 is a simplified block diagram of a conventional turbo decoder 20. A subset of the input detected bits is provided to decoder-1 21, which produces extrinsic information. The extrinsic information is interleaved by an interleaver 22 and then provided, along with another, possibly overlapping, subset of the input bits, to decoder-2 23.

Decoder-2 then produces extrinsic information, which is de-interleaved by a de-interleaver 24 and provided back to decoder-1. Running decoder-1 and then decoder-2 can be considered as either one iteration or two. In either case, the process is repeated until the CRC checks (CRC checking not shown), or the maximum number of iterations is reached.

Figure 3:
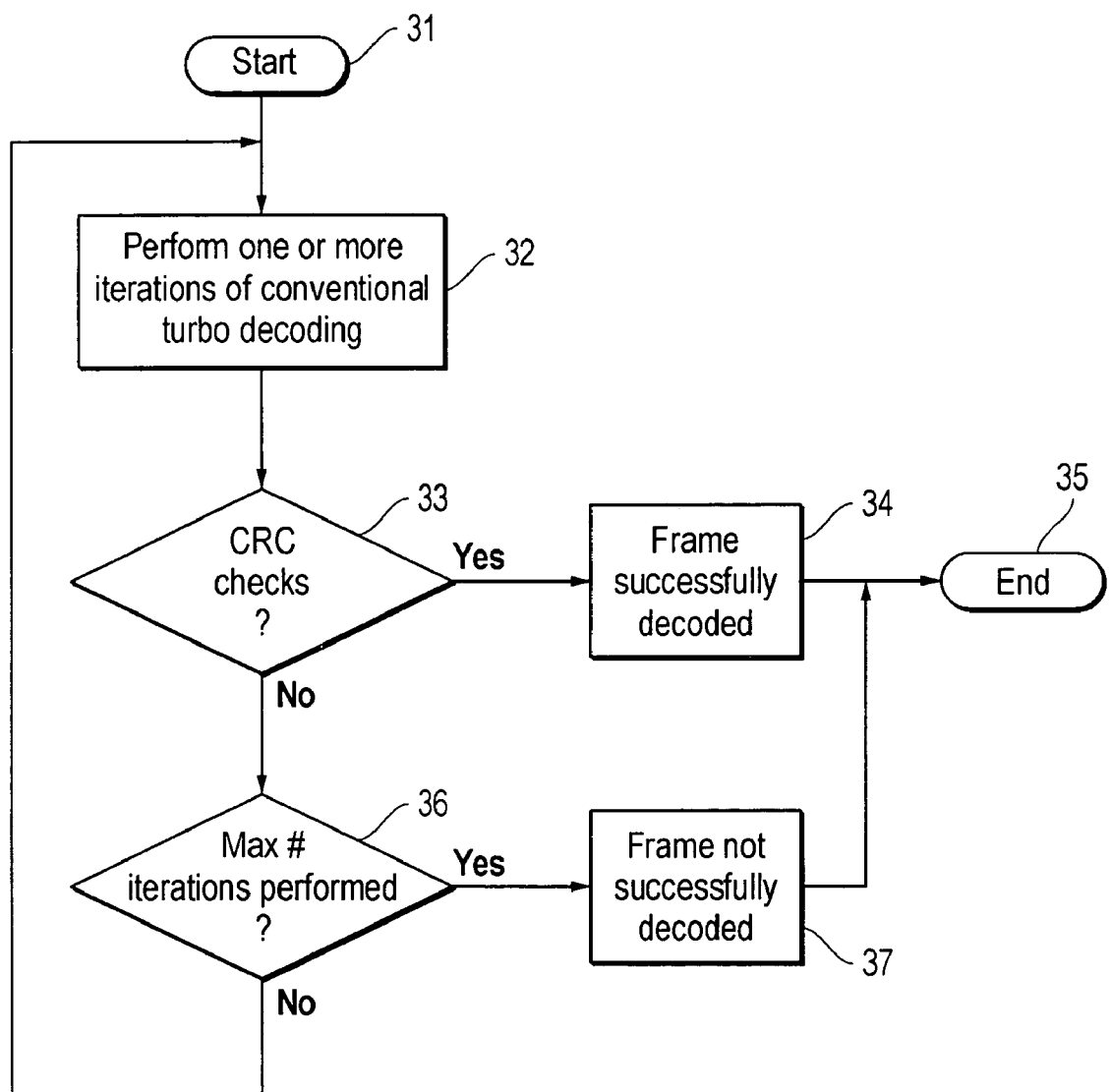
FIG. 3 is a flow chart illustrating the steps of the conventional turbo decoding process.

FIG. 3 is a flow chart illustrating the steps of the conventional turbo decoding process. The process starts at step 31 and proceeds to step 32 where one or more iterations of conventional turbo decoding are performed to produce a decoded sequence. At step 33, it is determined whether the CRC checks for the decoded sequence. If so, the process moves to step 34 where the frame is considered to be successfully decoded, and the process ends at step 35. However, if the CRC does not check at step 33, the process moves to step 36 where it is determined whether the maximum number of turbo decoding iterations have been performed. If not, the process returns to step 32 and performs one or more additional iterations of turbo decoding, and repeats the process. However, if the maximum number of turbo decoding iterations have been performed at step 36, the process moves to step 37 where it is determined that the frame was not successfully decoded. The process then ends at step 35.

Figure 4:
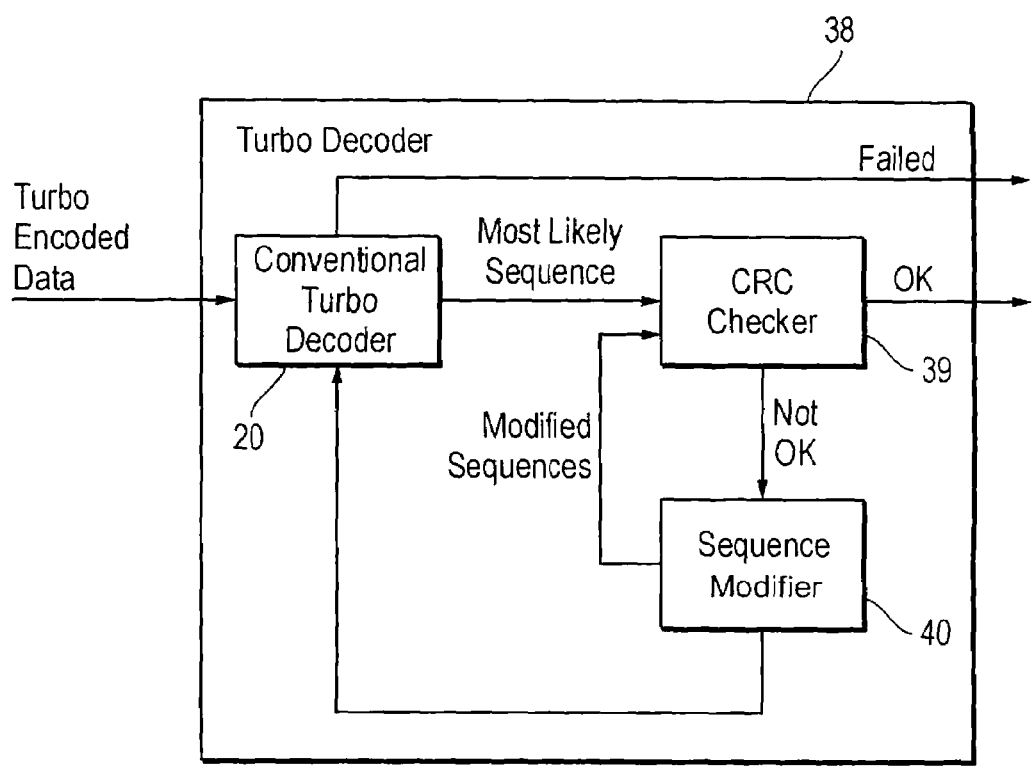
FIG. 4 is a simplified block diagram of an embodiment of the turbo decoder of the present invention.

FIG. 4 is a simplified block diagram of an embodiment of a turbo decoder 38 of the present invention. Turbo encoded data enters the turbo decoder and the conventional turbo decoder 20 performs an iteration of turbo decoding on the data. The output is a sequence of symbols, which is the most likely sequence (as estimated by the decoder) to be a proper decoding of the data. The most likely sequence is sent to a CRC checker 39. If the CRC check passes, the sequence is output as successfully decoded data. If the CRC check does not pass, the sequence is forwarded to a sequence modifier 40, which tries a number of successive modifications to the sequence, and resubmits the modified sequence to the CRC checker after each modification. As discussed in further detail below, the sequence modifier modifies the sequence so that each successive sequence is the next most likely sequence to be a proper decoding of the data. If, after a maximum number of modified sequences are tried, the CRC check has not passed, the sequence modifier notifies the conventional turbo decoder 20, and a second iteration of turbo decoding is performed. Again, a most likely sequence of symbols is output and sent to the CRC checker 39. If the CRC check does not pass, the sequence is forwarded to the sequence modifier 40, which sequentially tries a number of modifications to the sequence produced by the second iteration. Each modification is CRC checked until either the CRC check passes or the maximum number of modified sequences are tried. The sequence modifier may be programmed to try fewer numbers of modified sequences for each iteration as the number of turbo decoding iterations increases. When a maximum number of turbo decoding iterations has been performed without success, the conventional turbo decoder 20 reports a decoding failure.

Figure 5:
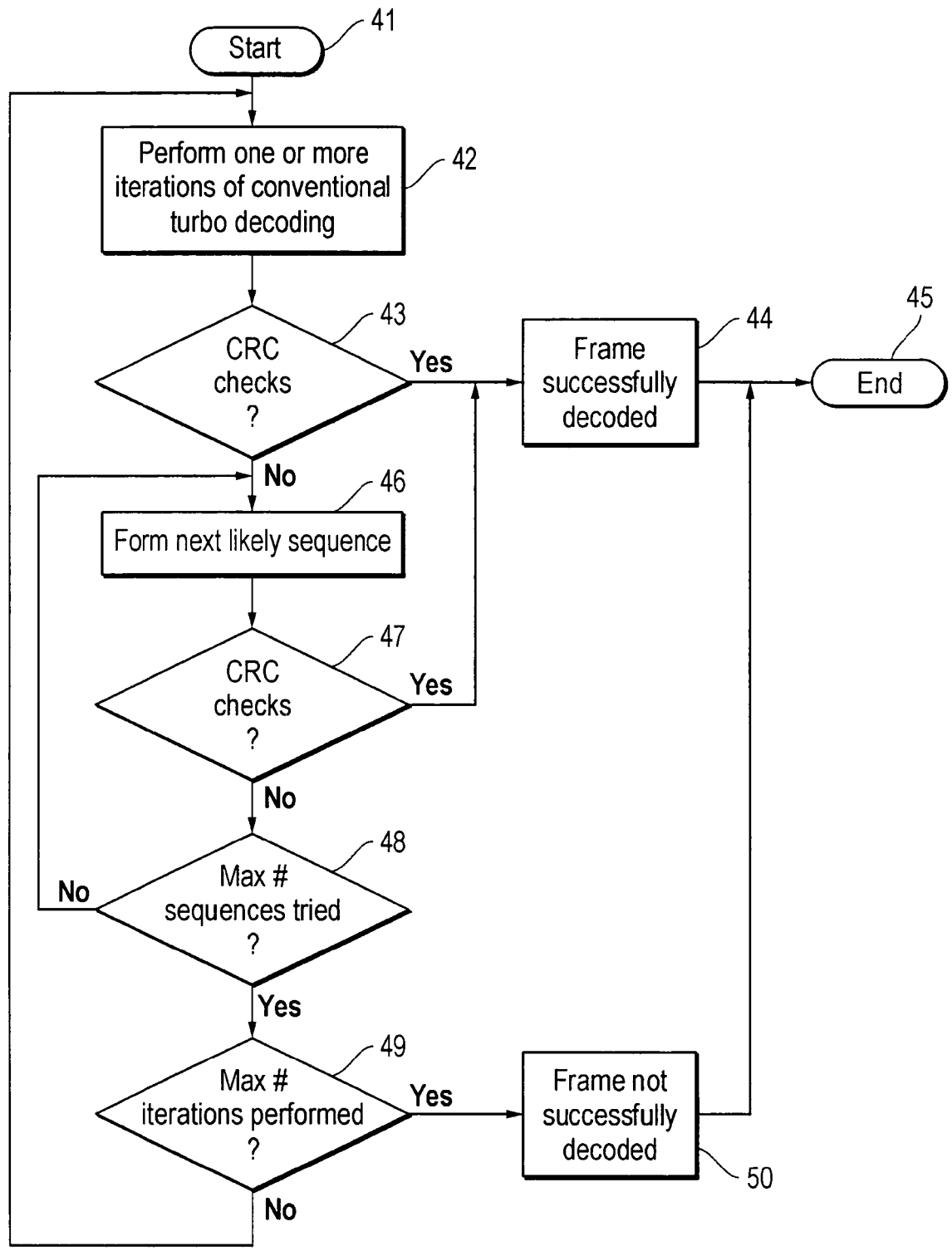
FIG. 5 is a flow chart illustrating the steps of an exemplary embodiment of the turbo decoding process of the present invention.

FIG. 5 is a flow chart illustrating the steps of an exemplary embodiment of the turbo decoding process of the present invention. The process starts at step 41 and proceeds to step 42 where one or more iterations of conventional turbo decoding are performed to produce one or more decoded sequences. At step 43, it is determined whether the CRC checks for the most likely decoded sequence. If so, the process moves to step 44 where the frame is considered to be successfully decoded, and the process ends at step 45. However, if the CRC does not check at step 43, the process moves to step 46 where a next most likely sequence is formed. At step 47, it is determined whether the CRC checks for the next most likely sequence. If so, the process moves to step 44 where the frame is considered to be successfully decoded, and the process ends at step 45.

However, if the CRC does not check at step 47, the process moves to step 48 where it is determined whether the maximum number of sequences has been CRC-checked. If not, the process returns to step 46, forms the next most likely sequence, and repeats the CRC check. However, if the maximum number of sequences has been CRC-checked at step 48, the process moves to step 49 where it is determined whether the maximum number of turbo decoding iterations have been performed. If not, the process returns to step 42 and performs one or more additional iterations of turbo decoding, and then repeats the process. However, if the maximum number of turbo decoding iterations have been performed at step 49, the process moves to step 50 where it is determined that the frame was not successfully decoded. The process then ends at step 45.

The $K^{th}$ most likely decoded sequence may be determined as follows. The likelihood of a decoded sequence is the product of the likelihoods of the individual symbols in the sequence. Thus, the loglikelihood of the decoded sequence is the sum of the loglikelihoods of the individual symbols, which is related to the sum of the soft values with the modulation removed. Specifically, consider determining the loglikelihood (LL) that a bit equals b. A scaled version of this is given by:

$$LL(\text{bit}=b)=b\ d$$

where d is the soft bit value. For example, if d=+2, then $$LL(\text{bit}=+1)=2$$

$$LL(\text{bit}=-1)=-2.$$

In this case, the decoded symbol would be +1 because this value gives the largest LL. To reverse the bit would be to assume that the bit is −1 and its LL is −2. In terms of the sum of LL values for the sequence, reversing the sign of this bit reduces the sum by 4 (twice the amplitude of the soft value).

The "first" most likely sequence is obtained by taking the sign of the soft bit values. The second most likely sequence is obtained by simply identifying the bit with the smallest soft value amplitude and reversing its sign. If there is a two-way tie, then one of the bits in the two-way tie may be arbitrarily selected and its sign reversed. In this case, if the CRC check still fails, the third most likely sequence is formed by reversing the sign of the other bit in the two-way tie. Otherwise, the third most likely sequence is obtained from the first most likely sequence by reversing the sign of the bit with the second smallest soft value amplitude.

Determining the fourth most likely sequence is more complex. The bit that will have its sign reversed is selected by starting with the first most likely sequence, and then either reversing the sign of the bit with the third smallest soft value amplitude, or reversing the signs of the two bits with the smallest and second smallest soft value amplitudes (i.e. the bits that had their signs reversed for the second and third most likely sequences). The choice is made by comparing the third smallest soft value with the sum of the smallest and second smallest soft values. If the third smallest soft value amplitude is less than the sum of the smallest and second smallest soft value amplitudes, then the sign of the bit with the third smallest soft value amplitude is reversed. Otherwise, the signs of the bits having the smallest and second smallest soft value amplitudes are reversed. These two alternatives are illustrated in Table 1 and Table 2, below.

TABLE 1

| Symbol Index | Soft Value | K<sup>th</sup> Most Likely Sequence | Sequence |
|---|---|---|---|
| 1 | −1 | First | −1 +1 −1 +1 |
| 2 | +2 | Second | +1 +1 −1 +1 |
| 3 | −4 | Third | −1 −1 −1 +1 |
| 4 | +8 | Fourth | +1 −1 −1 +1 |
|   |   | Fifth | −1 +1 +1 +1 |

Table 1 illustrates an example process of selecting the bit (or bits) that will have its sign reversed to form the second through fifth most likely sequences. In each sequence, the bit with its sign reversed is shown in bold. As shown in the left side of the table, the amplitude value of the bits increases from left to right. Therefore, to form the second most likely sequence, the sign of the leftmost bit is reversed. The third most likely sequence is formed by reversing the sign of the bit with the second smallest soft value amplitude. The fourth most likely sequence is formed by reversing the signs of both the first and second bits because the sum of the first and second bits is less than the amplitude value of the third bit. The fifth most likely sequence is then formed by reversing the sign of the third bit. A similar process occurs for subsequent sequences.

TABLE 2

| Symbol Index | Soft Value | K<sup>th</sup> Most Likely Sequence | Sequence |
|---|---|---|---|
| 1 | −1 | First | −1 +1 −1 +1 |
| 2 | +1.5 | Second | +1 +1 −1 +1 |
| 3 | −2 | Third | −1 −1 −1 +1 |
| 4 | +3 | Fourth | −1 +1 +1 +1 |
|   |   | Fifth | +1 −1 −1 +1 |

Table 2 illustrates an example process of selecting the bit (or bits) that will have its (or their) sign reversed to form the second through fifth most likely sequences. In each sequence, the bit with its sign reversed is shown in bold. As shown in the left side of the table, the amplitude value of the bits increases from left to right. Therefore, to form the second most likely sequence, the sign of the leftmost bit is reversed. The third most likely sequence is formed by reversing the sign of the bit with the second smallest soft value amplitude. The fourth most likely sequence is formed by reversing the sign of the third bit because the sum of the amplitudes of the first and second bits is greater than the amplitude value of the third bit. The fifth most likely sequence is then formed by reversing the signs of both the first and second bits. A similar process occurs for subsequent sequences.

In general, for the K$^{th}$ most likely sequence, one must consider reversing the signs of one, two, three . . . L symbols, where L depends on K in a straightforward way.

Computations can be performed efficiently, so that computing the K$^{th}$ most likely sequence benefits from computations performed previously. Basically this is a problem of forming partial sums in increased order. Any solution to such a general problem may be used here. Specifically, the next most likely sequence is determined by comparing the "open" end nodes of a decision tree. This tree can be constructed once, off-line, then used each time it is needed.

Figure 6:
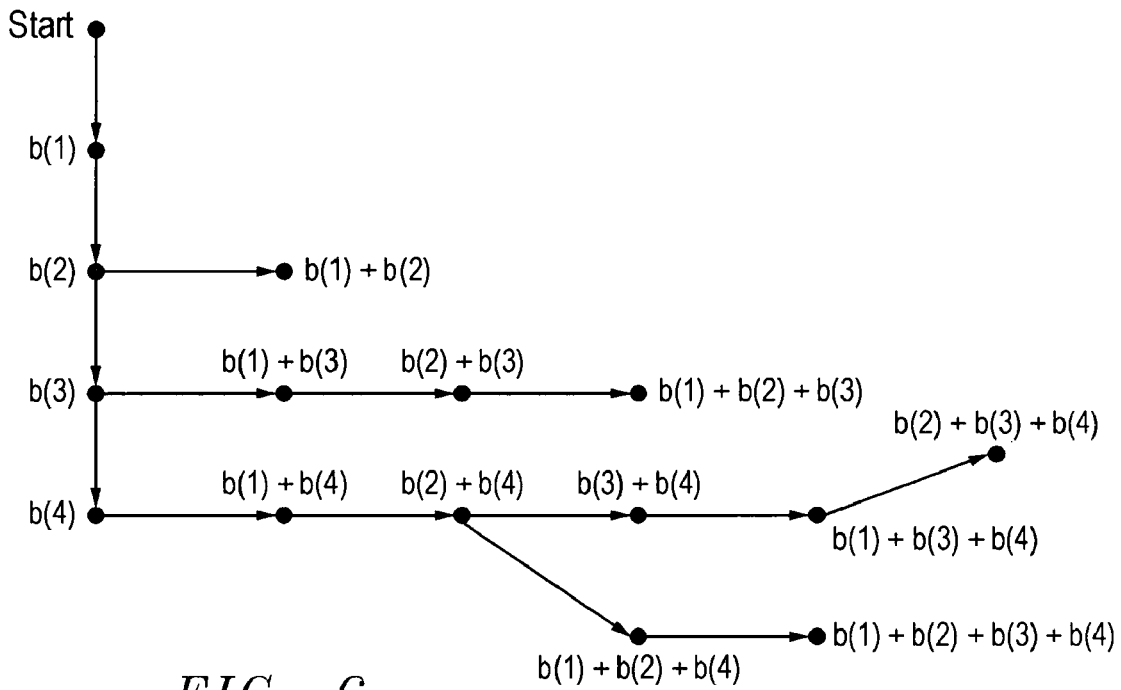
FIG. 6 illustrates a first exemplary decision tree for forming multiple sequences for CRC checking.

FIG. 6 illustrates and exemplary decision tree for the case in which only four bits with the four smallest soft value amplitudes (ordered so that b(1) is smallest) are allowed to have their signs reversed. Each node of the decision tree is labeled by which bits have their signs reversed, for example, b(1), b(2), b(3), and so on. Associated with each node is a metric corresponding to the sum of the soft value magnitudes of the bits having their signs reversed. Note that for the first set of bits, there is no need to store the metric because it is not used. Whenever the CRC checks, the process is stopped, and the detected symbol values correspond to the sequence for which the CRC checked.

The start node corresponds to checking the CRC for the decoded sequence (i.e., the most likely sequence in which no bits have their signs reversed). The metric for this node, though not needed, would be zero (0). If the CRC does not check, the process moves to the node labeled b(1) and reverses the sign of b(1). The metric for this node, through also not needed, would be the magnitude of the soft value magnitude of b(1). The CRC is then checked. If the CRC does not check, the process moves to node b(2) and reverses the sign of b(2). The metric for this node, though also not needed, would be the magnitude of the soft value of b(2). The CRC is then checked.

If the CRC does not check when the sign of b(2) is reversed, then the process considers reversing the signs of multiple nodes and storing metrics for these nodes. Specifically, as noted in Tables 1 and 2, the process compares the metric for node b(3) with the metric for the sum b(1)+b(2). The process then proceeds to the node whose metric is the smallest. At that node, the signs of the bits are reversed, and the CRC is checked.

If the CRC does not check, the process extends the node just considered, and compares the metrics for all end nodes not "closed" (i.e., CRC examined). For example, suppose as in Table 2, the metric for b(3) is smaller than the metric for b(1)+b(2). If the CRC did not check when the sign of b(3) was reversed, the process next considers nodes b(1)+b(2), b(1)+b(3), and b(4). Observe that b(1)+b(3) can be eliminated because it must be larger than b(1)+b(2) because of the way the bits are ordered. Thus, while all three nodes are end nodes, the process need only compare b(1)+b(2) with b(4). If, for example, b(1)+b(2) is smaller, the signs of b(1) and b(2) are reversed, and the CRC is checked. If the CRC again does not check, the process is continued, only now node b(1)+b(2) is considered closed and is not considered further.

Figure 7:
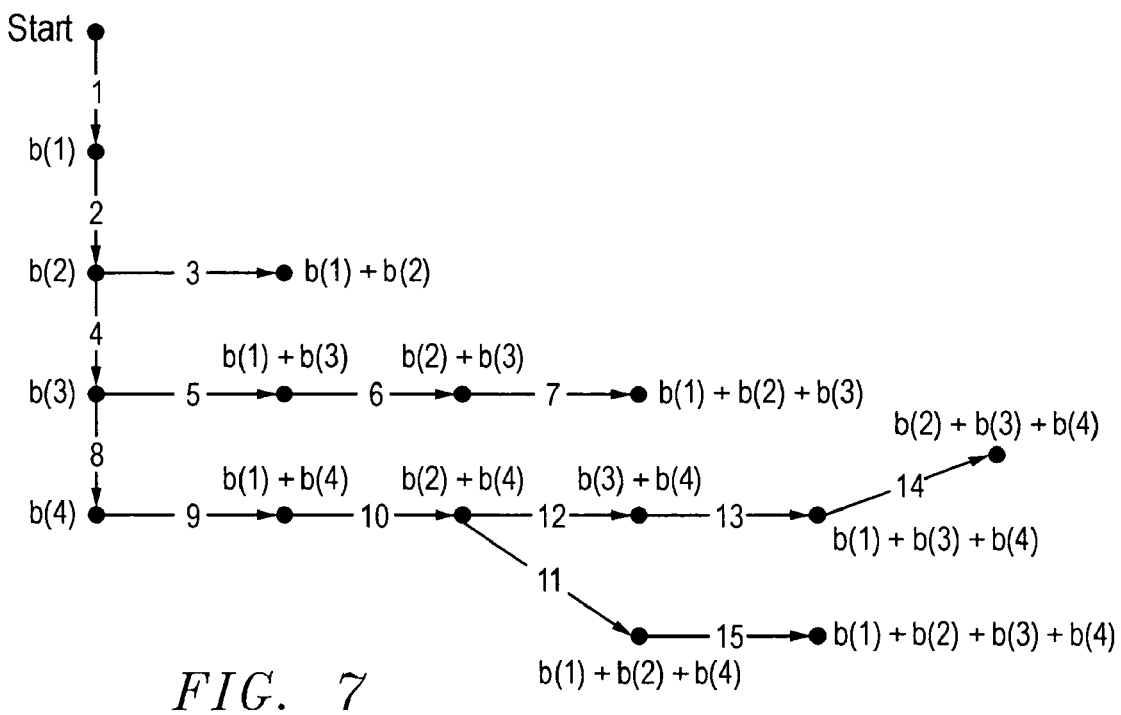
FIG. 7 illustrates a second exemplary decision tree, which corresponds to the example given in Table 1.

FIG. 7 illustrates a decision tree for the example given in Table 1. The numbers on the links indicate the order in which the links are traversed. As noted above, in this example, the fourth most likely sequence is formed by reversing the signs of both b(1) and b(2) because the sum of the metrics of b(1) and b(2) is less than the metric of b(3). The fifth most likely sequence is then formed by reversing the sign of b(3). Note, the restriction that only four bits can have their signs reversed means that at some point, the process is no longer determining the K$^{th}$ most likely sequence in order from K=first, second, etc. The restriction can be used to simplify the process. However, in general, the restriction is not needed. In this case, the decision tree continues to expand.

Figure 8:
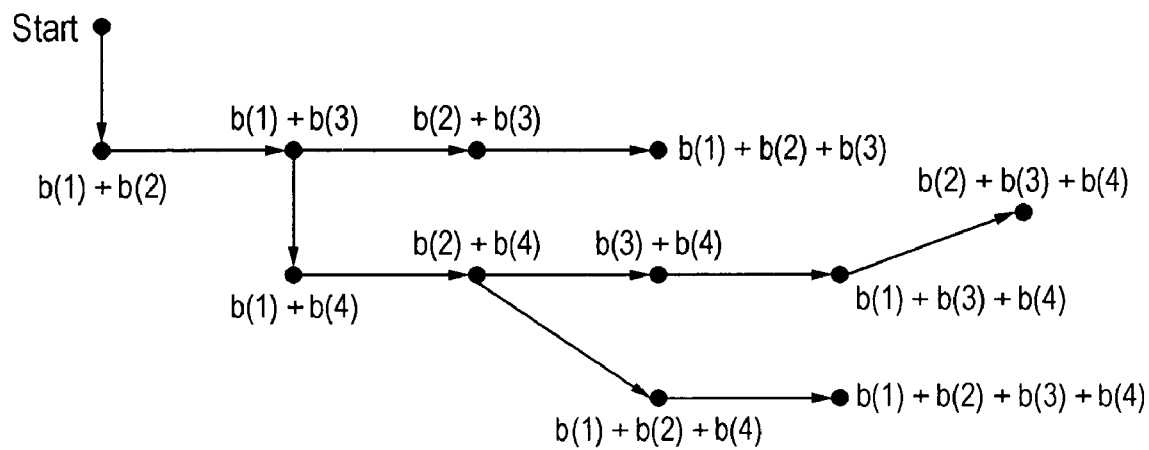
FIG. 8 illustrates a third exemplary decision tree in which only multiple bits have their signs reversed.

FIG. 8 illustrates a decision tree in which only multiple bits have their signs reversed. Due to the nature of turbo codes, it is expected that error events involve two or more bit errors. Thus, it is reasonable to skip sequences that involve reversing the sign of only a single bit.

A disadvantage of the decision tree approach is that it sometimes ends up comparing more than two nodes when only two nodes need to be compared. Also, comparisons are sometimes made when no comparison is needed at all. A more efficient approach is to use a state space approach, as described below.

Figure 9:
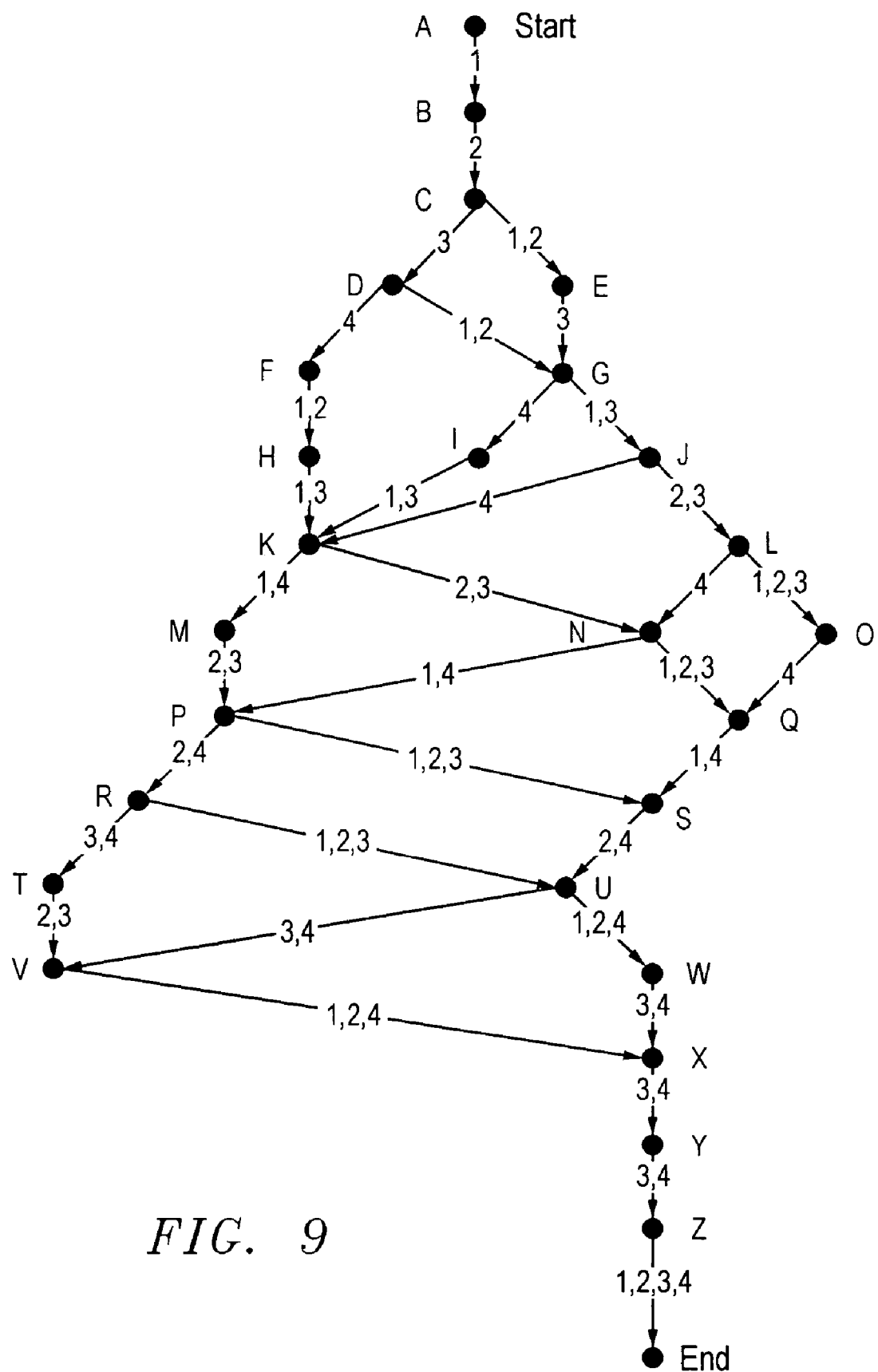
FIG. 9 illustrates a first embodiment of a state space approach for forming multiple sequences for CRC sequences.

FIG. 9 illustrates a state space approach for forming sequences. In the example illustrated in FIG. 9, up to four bits may have their signs reversed. In this example, single bit errors are allowed. From a start state (A), there is only one link, which goes to state B. The label "1" on the link indicates that b(1) should have its sign reversed. A CRC check is then performed, and if the CRC does not check, the process moves from state B to state C where it considers reversing the sign of only b(2). The CRC is again checked, and if the CRC does not check, the process considers two links, either proceeding to state D and reversing the sign of only b(3), or proceeding to state E and reversing the signs of both b(1) and b(2). Which path to take is determined by the metrics previously described. Basically, the magnitude of the soft value for b(3) is compared to the sum of the magnitudes of the soft values for b(1) and b(2). If the magnitude of the soft value for b(3) is smaller, then the process proceeds to state D. Otherwise, the process proceeds to state E. The process continues to other states in a similar manner. Note that sometimes there is no need to compute and compare metrics. For example, there is only one link out of state F, leading to state H, and thus no comparison is required.

The use of state space can be implemented using a table such as Table 3 below.

TABLE 3

| State | Choice? | Next 1 | Reverse 1 | Next 2 | Reverse 2 |
|---|---|---|---|---|---|
| A | N | B | 1 | | |
| B | N | C | 2 | | |
| C | Y | D | 3 | E | 1,2 |
| D | Y | F | 4 | G | 1,2 |
| E | N | G | 3 | | |
| F | N | H | 1,2 | | |
| G | Y | I | 4 | J | 1,3 |
| H | N | K | 1,3 | | |
| I | N | K | 1,3 | | |
| J | Y | K | 4 | L | 2,3 |
| K | Y | M | 1,4 | N | 2,3 |
| L | Y | N | 4 | O | 1,2,3 |
| M | N | P | 2,3 | | |
| N | Y | P | 1,4 | Q | 1,2,3 |
| O | N | Q | 4 | | |
| P | Y | R | 2,4 | S | 1,2,3 |
| Q | N | S | 1,4 | | |
| R | Y | T | 3,4 | U | 1,2,3 |
| S | N | U | 2,4 | | |
| T | N | V | 1,2,3 | | |
| U | Y | V | 3,4 | W | 1,2,4 |
| V | N | X | 1,2,4 | | |
| W | N | X | 3,4 | | |
| X | N | Y | 1,3,4 | | |
| Y | N | Z | 2,3,4 | | |
| Z | N | END | 1,2,3,4 | | |

The first column corresponds to the current state of the process. The second column indicates (Yes or No) whether the process has a choice as to which state to proceed to next. Thus, "N" indicates that there is no choice because there is only one state to which the process can proceed. The third column indicates one possible next state (the only one if there is no choice). The fourth column indicates which bits would have their signs reversed, and thus indicates how to compute a metric, if needed. The fifth and sixth columns, if non-empty, indicate the state and bits corresponding to the other possible choice whenever the second column indicates that there is a choice.

Note that certain combinations of bit sign reversals occur more than once. For example, row C and row D both include reversing the signs of b(1) and b(2). The sum of the soft value magnitudes is computed when in state C. If the next state is state D, this sum need not be recomputed. In this case, it is known when the process is in state D that this metric was computed, because the process can only get to state D from state C. There are other cases where the metric may have been computed earlier or it may not have. In this case, the process may check to see if the metric has already been computed, and if so, the previously computed value may be used.

Figure 10:
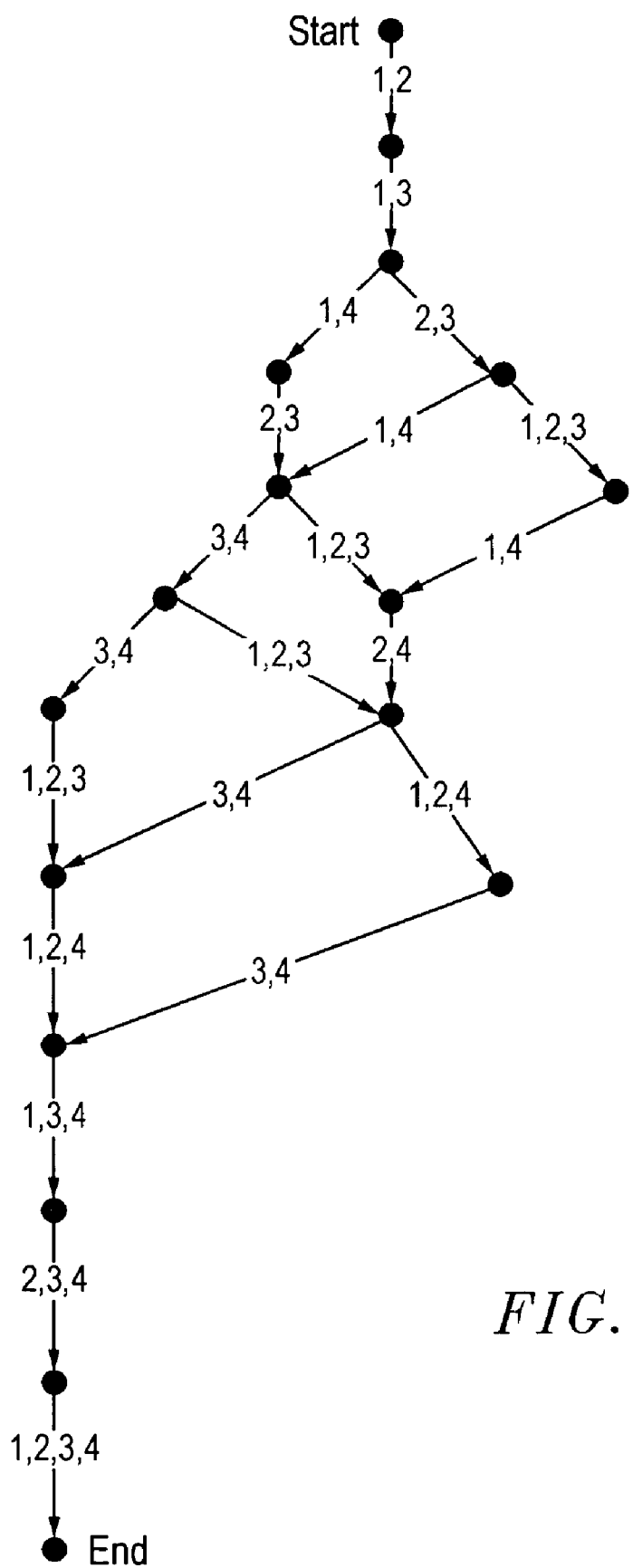
FIG. 10 illustrates a second embodiment of a state space approach for forming multiple sequences for CRC sequences.

FIG. 10 illustrates another embodiment of the state space in which sign reversals of single bits are not considered. Note that the restriction of reversing the sign of a maximum of four bits is used to simplify the process. Without this restriction, the state space would continue to grow, rather than collapsing into one end state.

In another alternative embodiment, approximate forms are utilized to form the sequences prior to checking the CRC. Instead of using a decision tree or state space approach, a fixed list of sequences is tried. The sequences correspond to a predefined pattern of bit sign reversals. For example, the following list of sequences may be utilized:

(1) Try the decoded (most likely) sequence (i.e., no sign reversals);
(2) Try reversing the signs of b(1) and b(2);
(3) Try reversing the signs of b(1) and b(3);
(4) Try reversing the signs of b(1) and b(4); and
(5) Try reversing the signs of b(2) and b(3).

The bits may be ordered in non-decreasing amplitude. With this approach, the likelihoods of the sequences may be out of order in the list. For example, the fifth most likely sequence may be tried before the fourth most likely sequence. However, the approach is simpler that using the decision tree or state space approach.

As will be recognized by those skilled in the art, the innovative concepts described in the present application can be modified and varied over a wide range of applications. Accordingly, the scope of patented subject matter should not be limited to any of the specific exemplary teachings discussed above, but is instead defined by the following claims.

What is claimed is:

1. A method of decoding turbo encoded data, said method comprising the steps of:
   performing a decoding iteration to produce a sequence of symbols, each symbol having an amplitude value and a positive or negative sign;
   detecting whether the decoded sequence of symbols contains an error;
   if the decoded sequence of symbols contains an error, performing a first modification of the decoded sequence by reversing the positive or negative sign of at least one symbol in the decoded sequence; and
   detecting whether the first modification has produced a sequence of symbols that is error free.

2. The method of claim 1, wherein the step of performing a decoding iteration includes performing an iteration of turbo decoding.

3. The method of claim 2, wherein the step of detecting whether the decoded sequence of symbols contains an error includes determining whether the decoded sequence passes a cyclic redundancy check (CRC).

4. The method of claim 3, wherein the step of detecting whether the first modification has produced a sequence of symbols that is error free includes determining whether the first modification has produced a sequence of symbols that passes the CRC check.

5. The method of claim 1, wherein the step of performing a first modification of the decoded sequence by reversing the positive or negative sign of at least one symbol in the decoded sequence includes reversing the positive or negative sign of a first symbol having the smallest amplitude value among the symbols in the sequence.

6. The method of claim 1, further comprising the steps of:
if the first modification has not produced a sequence of symbols that is error free, performing a second modification of the decoded sequence, wherein the positive or negative sign of the first symbol remains in its original state, and the positive or negative sign of a second symbol is reversed, said second symbol having the second-smallest amplitude value among the symbols in the sequence; and
detecting whether the second modification has produced a sequence of symbols that is error free.

7. The method of claim 6, further comprising the steps of:
if the second modification has not produced a sequence of symbols that is error free, performing a third modification of the decoded sequence, comprising the steps of:
determining whether the amplitude value of a third symbol having the third-smallest amplitude value among the symbols in the sequence is greater than the sum of the amplitude values of the first and second symbols;
if the amplitude value of the third symbol is greater than the sum of the amplitude values of the first and second symbols, reversing the positive or negative signs of both the first and second symbols while retaining the positive or negative sign of the third symbol in its original state; and
if the sum of the amplitude values of the first and second symbols is greater than the amplitude value of the third symbol, reversing the positive or negative sign of the third symbol while retaining the positive or negative signs of both the first and second symbols in their original states; and
detecting whether the third modification has produced a sequence of symbols that is error free.

8. The method of claim 1, further comprising performing additional modifications of the decoded sequence by reversing the positive or negative sign of additional symbols in the decoded sequence, and detecting whether any of the additional modifications produces a sequence of symbols that is error free, until a maximum number of sequences for the decoding iteration have been checked, or an error-free sequence is detected, whichever is first.

9. The method of claim 8, wherein the step of performing additional modifications of the decoded sequence includes reversing the positive or negative sign of additional symbols selected through the use of a decision tree.

10. The method of claim 8, wherein the step of performing additional modifications of the decoded sequence includes reversing the positive or negative sign of additional symbols selected through the use of a state space approach.

11. The method of claim 8, wherein the step of performing additional modifications of the decoded sequence includes reversing the positive or negative sign of additional symbols selected through the use of a predefined list comprising at least one of symbols, symbol combinations, and a combination of both symbols and symbol combinations.

12. The method of claim 8, further comprising the steps of:
if the maximum number of sequences for the decoding iteration have been checked, performing a new decoding iteration to produce a new sequence of symbols;
detecting whether the new sequence of symbols contains an error;
if the new sequence of symbols contains an error, performing modifications of the new sequence by reversing the positive or negative signs of symbols in the new sequence, and detecting whether any of the additional modifications produces a sequence of symbols that is error free, until a maximum number of sequences for the new decoding iteration have been checked, or an error-free sequence is detected, whichever is first.

13. A method of decoding turbo encoded data, said method comprising the steps of:
(a) performing a first turbo decoding iteration to produce a most likely sequence of symbols, each symbol having an amplitude value and a positive or negative sign;
(b) checking the most likely sequence of symbols to determine whether the most likely sequence contains an error;
(c) if the most likely sequence of symbols contains an error, forming a next most likely sequence by reversing the positive or negative sign of at least one symbol in the most likely sequence;
(d) checking the next most likely sequence of symbols to determine whether the next most likely sequence contains an error; and
(e) repeating steps (c) and (d) for less likely sequences until a maximum number of sequences for the first decoding iteration have been checked, or an error-free sequence is detected, whichever is first.

14. The method of claim 13, further comprising the steps of:
(f) if the maximum number of sequences for the first decoding iteration have been checked, performing a next turbo decoding iteration to produce another most likely sequence of symbols; and
(g) repeating steps (b) through (e) until an error-free sequence is detected.

15. The method of claim 14, further comprising the steps of:
(h) if an error-free sequence is not detected, determining whether a maximum number of decoding iterations have been performed;
(i) if the maximum number of decoding iterations have not been performed, repeating steps (f) and (g); and
(j) if the maximum number of decoding iterations have been performed, determining that the decoding has not been successful.

16. The method of claim 13, wherein step (c) includes forming a next most likely sequence by reversing the positive or negative sign of at least two symbols in the most likely sequence.

17. A method of decoding turbo encoded data, said method comprising the steps of:
performing a plurality of decoding iterations, each iteration producing a sequence of symbols;
following each iteration, detecting whether the sequence of symbols produced by each iteration contains an error;
if a sequence produced by an iteration contains an error, sequentially performing a predefined number of modifications to the sequence produced by each iteration;

following each modification of each sequence, detecting whether the modified sequence of symbols contains an error; and if a sequence is detected with no errors, forwarding the error-free sequence as decoded data.

18. An apparatus for decoding turbo encoded data, said apparatus comprising:

turbo decoding means for performing a turbo decoding iteration to produce a sequence of symbols, each symbol having an amplitude value and a positive or negative sign;

error-detecting means for detecting whether the decoded sequence of symbols contains an error; and sequence-modifying means responsive to detection of an error, for performing a first modification of the decoded sequence by reversing the positive or negative sign of at least one symbol in the decoded sequence, and forwarding the modified sequence to the error-detecting means, wherein the error-detecting means detects whether the first modification has produced a sequence of symbols that is error free.

19. The apparatus of claim 18, wherein the sequence-modifying means includes means for performing a plurality of successive modifications and for forwarding the modified sequences to the error-detecting means, each of said modified sequences being successively less likely to be a properly decoded sequence.

20. The apparatus of claim 19, wherein the error-detecting means individually checks each of the plurality of successive modifications, and if an error is detected, notifies the sequence-modifying means to produce another modified sequence.

21. The apparatus of claim 20, wherein the sequence-modifying means informs the turbo decoding means when a maximum number of sequence modifications have been tried without a successful decoding, and the turbo decoding means includes means for performing additional turbo decoding iterations up to a maximum number of iterations, wherein the plurality of successive modifications are performed after each iteration.

* * * * *